(12) United States Patent
Lee et al.

(10) Patent No.: US 9,887,380 B2
(45) Date of Patent: Feb. 6, 2018

(54) DISPLAY APPARATUS INCLUDING BONDING MEMBER HAVING A CORE-SHELL STRUCTURE AND METHOD OF MANUFACTURING THE SAME

(71) Applicant: SAMSUNG DISPLAY CO., LTD., Yongin, Gyeonggi-Do (KR)

(72) Inventors: Soyoung Lee, Yongin (KR); Sooyoun Kim, Yongin (KR); Seungyong Song, Yongin (KR); Sanghwan Cho, Yongin (KR)

(73) Assignee: SAMSUNG DISPLAY CO., LTD., Yongin, Gyeonggi-Do (KR)

( * ) Notice: Subject to any disclaimer, the term of this patent is extended or adjusted under 35 U.S.C. 154(b) by 0 days.

(21) Appl. No.: 14/796,082

(22) Filed: Jul. 10, 2015

(65) Prior Publication Data
US 2016/0181565 A1    Jun. 23, 2016

(30) Foreign Application Priority Data
Dec. 19, 2014  (KR) .................. 10-2014-0184952

(51) Int. Cl.
*H01L 29/22* (2006.01)
*H01L 51/52* (2006.01)
*H01L 51/56* (2006.01)

(52) U.S. Cl.
CPC ........ *H01L 51/524* (2013.01); *H01L 51/5246* (2013.01); *H01L 51/5259* (2013.01); *H01L 51/56* (2013.01); *H01L 2251/5338* (2013.01)

(58) Field of Classification Search
CPC ........ H01L 51/52; H01L 51/56; H01L 51/524
USPC .................................. 257/98, 99, 100, 103
See application file for complete search history.

(56) References Cited

U.S. PATENT DOCUMENTS

| | | | |
|---|---|---|---|
| 8,242,524 B2* | 8/2012 | Koseki | H01L 33/56 |
| | | | 257/100 |
| 8,415,701 B2* | 4/2013 | Chung | H01L 25/0753 |
| | | | 257/100 |
| 2011/0018788 A1 | 1/2011 | Tanaka et al. | |
| 2011/0133170 A1 | 6/2011 | Oh et al. | |
| 2012/0133275 A1 | 5/2012 | Lee et al. | |
| 2013/0017405 A1 | 1/2013 | Benkoski et al. | |

(Continued)

FOREIGN PATENT DOCUMENTS

| | | |
|---|---|---|
| JP | 2011-028887 A | 2/2011 |
| KR | 10-2011-0062992 A | 6/2011 |
| KR | 10-2012-0046427 A | 5/2012 |

(Continued)

OTHER PUBLICATIONS

Proceedings of the First International Conference on Self Healing Materials Apr. 18-20, 2007, Noordwijk aan Zee, The Netherlands "Self-Healing of Metal Oxide Composite Materials", Liu, et al.

*Primary Examiner* — Hung Vu
(74) *Attorney, Agent, or Firm* — Lee & Morse, P.C.

(57) ABSTRACT

A display apparatus, including a substrate; a display unit on the substrate; a bonding member on the substrate and surrounding at least edges of the display unit; and a barrier film on the substrate, the bonding member interposed between the substrate and the barrier film, the bonding member including a core-shell structure, including a core including an oxide, and a shell including a polymer chemically bonded to the core.

19 Claims, 5 Drawing Sheets

(56) References Cited

U.S. PATENT DOCUMENTS

2015/0236213 A1* 8/2015 Tchoul .................. H01L 33/44
257/98

FOREIGN PATENT DOCUMENTS

| KR | 10-2012-0057286 A | 6/2012 |
|----|-------------------|--------|
| KR | 10-2013-0128212 A | 11/2013 |

* cited by examiner

DISPLAY APPARATUS INCLUDING BONDING MEMBER HAVING A CORE-SHELL STRUCTURE AND METHOD OF MANUFACTURING THE SAME

CROSS-REFERENCE TO RELATED APPLICATION

Korean Patent Application No. 10-2014-0184952, filed on Dec. 19, 2014, in the Korean Intellectual Property Office, and entitled: "Display Apparatus and Method Of Manufacturing The Same," is incorporated by reference herein in its entirety.

BACKGROUND

1. Field

One or more exemplary embodiments relate to a display apparatus and a method of manufacturing the same.

2. Description of the Related Art

The market for display apparatuses, which may include media that allow users to communicate with each other and access information, has increased with the development of informatization technology. Various forms of display apparatuses may include organic light-emitting displays (OLEDs), which may exhibit good performance, small thickness, light weight, and low power consumption.

SUMMARY

Embodiments may be realized by providing a display apparatus, including a substrate; a display unit on the substrate; a bonding member on the substrate and surrounding at least edges of the display unit; and a barrier film on the substrate, the bonding member interposed between the substrate and the barrier film, the bonding member including a core-shell structure, including a core including an oxide, and a shell including a polymer chemically bonded to the core.

The oxide may include titanium dioxide ($TiO_2$), titanium tetrachloride ($TiCl_4$), or trimethylaluminum ($Al(CH_3)_3$).

The oxide may react with moisture or oxygen, thereby forming an inorganic oxide.

The polymer may include polyvinylpyrrolidone (PVP), polyvinylalcohol, polymethyl methacrylate, polyacryl, polyester, or a mixture thereof.

The shell may surround all or a portion of the core in the core-shell structure.

The core-shell structure may have a spherical or cylindrical shape.

A diameter of a circular cross-section of the core-shell structure may be about 100 nm to about 100 μm.

The bonding member may include different materials covering each of the display unit and the edges of the display unit on the substrate.

The bonding member may cover the edges of the display unit on the substrate.

The bonding member may have a planar upper surface.

The substrate may be flexible.

The barrier film may include one or more stacked insulating layers.

Embodiments may be realized by providing a method of manufacturing a display apparatus, the method including preparing a substrate on which a display unit is formed; forming a barrier film unit; removing a protective layer from the barrier film unit; aligning the barrier film unit to match the substrate; and attaching the barrier film unit to the substrate.

Forming the barrier film unit may include preparing a barrier film; forming a bonding member including a core-shell structure on one surface of the barrier film; and forming the barrier film unit in which the barrier film, the bonding member, and the protective layer are sequentially stacked by attaching a protective layer onto the bonding member.

The method may further include applying pressure or heat to a region of the bonding member at edges of the display unit after attaching the barrier film unit to the substrate.

The bonding member may be at edges of the display unit.

Embodiments may be realized by providing a method of manufacturing a display apparatus, the method including preparing a substrate on which a display unit is formed; forming a bonding member by coating the substrate with a bonding member paste; preparing a barrier film; and attaching the barrier film onto the bonding member.

The bonding member paste may be sprayed onto the substrate from a nozzle.

The method may further include applying pressure or heat to a region of the bonding member at edges of the display unit after attaching the barrier film to the bonding member.

The bonding member may be at edges of the display unit.

BRIEF DESCRIPTION OF THE DRAWINGS

Features will become apparent to those of skill in the art by describing in detail exemplary embodiments with reference to the attached drawings in which.

DETAILED DESCRIPTION

Figure 1:
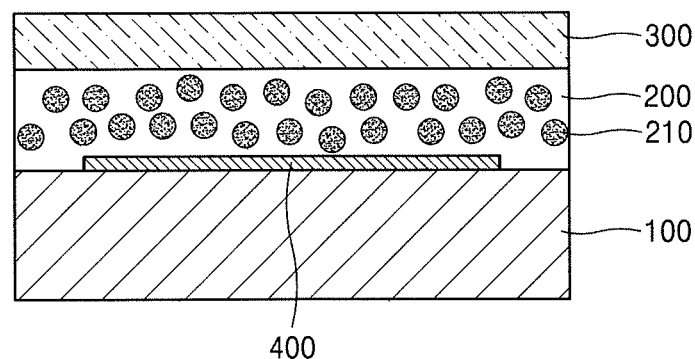
FIG. 1 illustrates a cross-sectional view of an encapsulation structure of a display apparatus according to an exemplary embodiment.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

It will be understood that although the terms "first", "second", etc., may be used herein to describe various components, these components should not be limited by these terms. These components are only used to distinguish one component from another.

It will be understood that when a layer, region, or component is referred to as being "formed on," another layer, region, or component, it can be directly or indirectly formed on the other layer, region, or component. That is, for example, intervening layers, regions, or components may be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present.

Hereinafter, embodiments will be described more fully with reference to the accompanying drawings. In the drawings, thicknesses are magnified to clearly express a plurality of layers and regions. In addition, in the drawings, some layers and regions may have exaggerated thicknesses for convenience of description. Like reference numerals refer to like elements throughout.

Embodiments may provide display apparatuses in various forms, such as, for example, organic light-emitting displays (OLEDs) and liquid crystal displays (LCDs). Features of embodiments will be described on the basis of an OLED.

FIG. 1 illustrates a cross-sectional view of an encapsulation structure of a display apparatus according to an embodiment.

Referring to FIG. 1, the display apparatus according to an embodiment may include a substrate 100, a display unit 400 on the substrate 100, a bonding member 200 formed on the substrate 100 so as to cover at least edges of the display unit 400, and a barrier film 300 attached onto the substrate 100 by interposing the bonding member 200 between the substrate 100 and the barrier film 300. The bonding member 200 may include a core-shell structure 210 including an oxide, e.g., an oxide corpuscle, and a polymer film chemically bonded to the oxide corpuscle.

The substrate 100 may be formed of various materials.

The substrate 100 may be formed of a flexible material. For example, the substrate 100 may include plastic having good thermostability and durability, such as, e.g., polyethylene terephthalate (PET), polyethylene naphthalate (PEN), polycarbonate (PC), polyarylate (PAR), polyetherimide (PEI), polyethersulfone (PES), or polyimide (PI). In an embodiment, the substrate 100 may be formed of various flexible materials.

As a selective embodiment, an OLED according to an embodiment may be a top emission type in which an image may be realized in a direction of the bonding member 200. For a top emission type, the substrate 100 does not have to be formed of a transparent material. An opposite substrate may be formed of a transparent material. The OLED may be a bottom emission type in which an image may be realized in a direction of the substrate 100, the substrate 100 may be formed of a transparent material, and the opposite substrate does not have to be formed of a transparent material.

The display unit 400 may be formed on the substrate 100. The term "display unit 400" in the specification refers to both an organic light-emitting device and a thin-film transistor array for driving the organic light-emitting device, i.e., both an image display part and a driving part for displaying an image. The display unit 400 may include a plurality of emission areas in which organic light-emitting devices are respectively arranged.

The bonding member 200 may be formed on the substrate 100 so as to cover at least an edge region of the display unit 400. The bonding member 200 may include the core-shell structure 210, wherein a core may be formed of an oxide corpuscle and a shell may be formed of a polymer chemically bonded to the oxide corpuscle.

The barrier film 300 may be attached onto the substrate 100 by interposing the bonding member 200 between the substrate 100 and the barrier film 300. The barrier film 300 may be commonly formed of an inorganic material. The barrier film 300 may include one or more stacked insulating layers.

Figure 2:
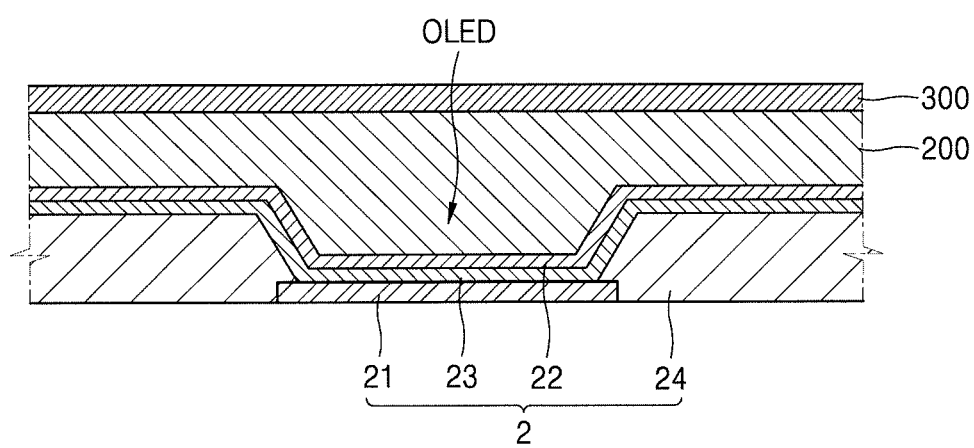
FIG. 2 illustrates a cross-sectional view of a display unit of the display apparatus of FIG. 1.

FIG. 2 illustrates a cross-sectional view of the display unit 400 of FIG. 1.

The display unit 400 may include various components to display an image. The display unit 400 may have a plurality of pixels arranged in a matrix form when viewing the display unit 400 from the top.

The display unit 400 may include an organic light-emitting device. The organic light-emitting device may include a stacked body of a lower electrode 21, an intermediate layer 23, and an upper electrode 22. The lower electrode 21 may be patterned for each pixel and have an island shape as shown in FIG. 2. In an embodiment, the lower electrode 21 may have a linear shape or a surface shape.

An insulating layer 24 which covers edges of the lower electrode 21 and through which the center of the lower electrode 21 is exposed may be further provided on the lower electrode 21.

The intermediate layer 23 may be formed on the lower electrode 21 and may include an organic emission layer which emits light. The intermediate layer 23 may be formed of an organic material. The lower electrode 21 may function as an anode, and a hole injection layer (HIL) and a hole transport layer (HTL) may be sequentially disposed between the lower electrode 21 and the organic emission layer. The upper electrode 22 may function as a cathode, and an electron transport layer (ETL) and an electron injection layer (EIL) may be sequentially disposed between the organic emission layer and the upper electrode 22. According to types of the organic material included in the organic emission layer, types, an order, and the number of function layers may vary. Polarities of the lower electrode 21 and the upper electrode 22 may be exchanged.

The organic emission layer may be patterned for each pixel, and the function layers such as the HIL, the HTL, the EIL, and the ETL may be commonly formed all over the substrate 100. In an embodiment, the organic emission layer may be commonly formed all over the substrate 100. For example, a plurality of organic emission layers which respectively emit, e.g., red, green, and blue lights may be vertically stacked or mixed to emit white light. A color conversion layer or a color filter for converting the emitted white color into a predetermined color may be separately provided.

The upper electrode 22 may be formed on the intermediate layer 23 such that the upper electrode 22 faces the lower electrode 21. The upper electrode 22 may be commonly formed all over the substrate 100. The OLED may be a bottom emission type in which light may be emitted in a direction of the substrate 100, the lower electrode 21 may be formed as a transparent electrode using a transparent conductive oxide (TCO) such as indium tin oxide (ITO), and the upper electrode 22 may be implemented as a reflective electrode by forming a low-resistive metal such as magnesium (Mg) with a thick thickness. The OLED may be a top emission type in which light may be emitted in an opposite direction of the substrate 100, the lower electrode 21 may be formed as a reflective electrode by further including a reflective layer such as silver (Ag), and the upper electrode 22 may be implemented as a translucent electrode by forming a low-resistive metal with a thin thickness.

A protective formed of an organic material may be further formed on the upper electrode 22 to protect the upper electrode 22 and improve flattening of an upper surface of the upper electrode 22. The OLED may a top emission type, and the protective layer including an organic layer having a high refractive index may improve an optical extraction capability of the organic emission layer through refractive index matching.

The OLED may be an active type, and an organic emission unit 2 may further include a driving circuit unit. The driving circuit unit may be electrically connected to each organic light-emitting device and may include at least two thin-film transistors (TFTs) and at least one capacitor. The driving circuit unit may drive the organic light-emitting device by applying a driving current to the organic light-emitting device according to a signal applied from a wiring.

The organic emission unit 2 may be protected from external moisture and oxygen. The organic light-emitting device may include an organic material, and the organic light-emitting device may be easily deteriorated, for example, due to external moisture and oxygen. An encapsulation means for sealing the organic emission unit 2 may be required, for example, thin-film encapsulation may be used for a flexible display apparatus so that the display apparatus may be folded or bent.

The encapsulation structure of the display apparatus according to an embodiment will now be described in more detail.

Figure 3:
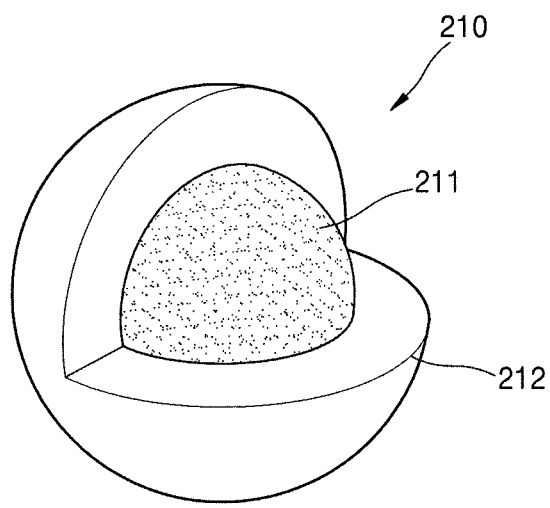
FIG. 3 illustrates a perspective view of a core-shell structure included in a bonding member of the display apparatus of FIG. 1.

FIG. 3 illustrates a perspective view of the core-shell structure 210 included in the bonding member 200 of the display apparatus of FIG. 1.

Referring back to FIG. 1, the bonding member 200 may be formed on the substrate 100 so as to cover at least the edges of the display unit 400. The bonding member 200 may include the core-shell structure 210 described below, which may be spread in an adhesive base.

Referring to FIG. 3, the bonding member 200 may include the core-shell structure 210 in which a core 211 may be formed of an oxide corpuscle and a shell 212 may be formed of a polymer chemically bonded to the core 211, wherein the oxide corpuscle may include titanium dioxide ($TiO_2$), titanium tetrachloride ($TiCl_4$), or trimethylaluminum ($Al(CH_3)_3$) and the polymer may include polyvinylpyrrolidone (PVP), polyvinylalcohol, polymethyl methacrylate, polyacryl, polyester, or a mixture thereof. The oxide corpuscle may react with moisture and/or oxygen to form inorganic oxide.

As a selective embodiment, the core-shell structure 210 may be formed in a spherical or cylindrical shape, i.e., a capsule or fiber type. The core-shell structure 210 may be formed in any form of a double-structure stereoscopic type. A diameter of a circular cross-section of the core-shell structure 210 may be about 100 nm to about 100 μm.

Figure 4:
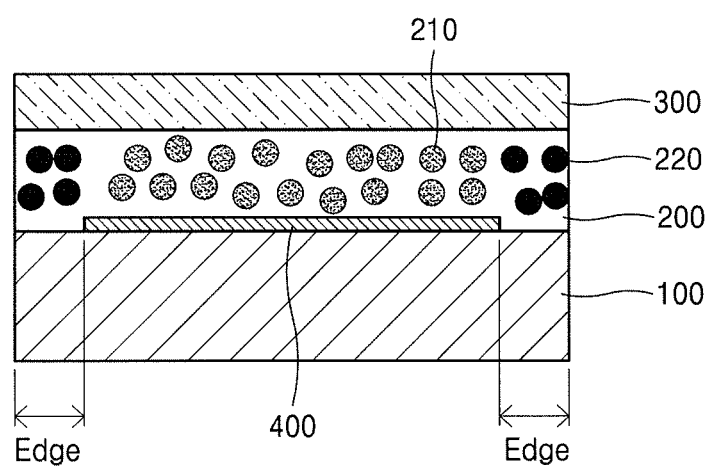
FIGS. 4 to 6 illustrate cross-sectional views of encapsulation structures of a display apparatus, according to exemplary embodiments.
Figure 5:
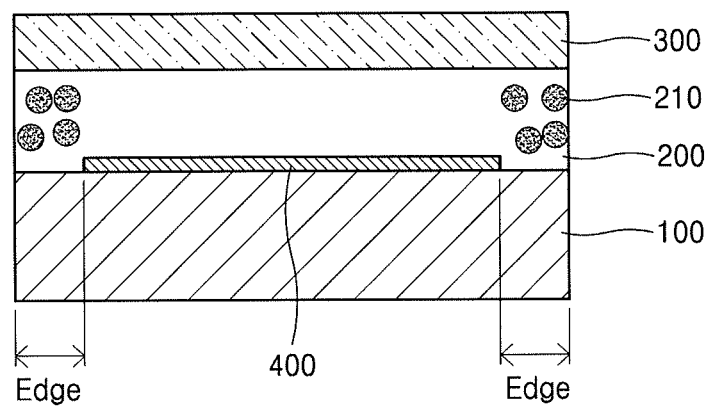
Figure 6:
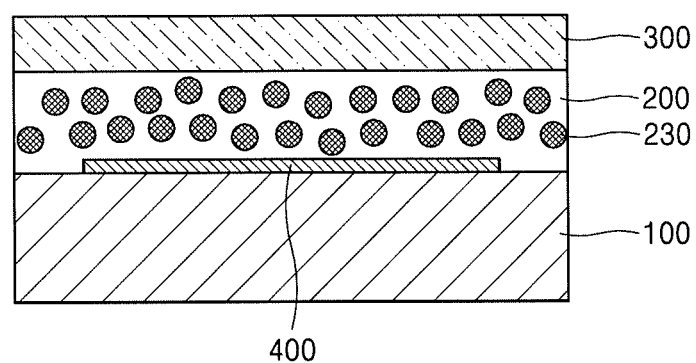

FIGS. 4 to 6 illustrate cross-sectional views of encapsulation structures of a display apparatus, according to embodiments.

FIG. 4 illustrates a structure in which, based on the structure of FIG. 1, the material property of the bonding member 200 at edges of the display unit 400 on an upper surface of the substrate 100 may be changed by applying pressure or heat to the edges of the display unit 400.

A physical impact, such as pressure or heat, may be applied to the core-shell structure 210 in which an inorganic oxide precursor may be protected by a polymer film, the core-shell structure 210 may be destroyed, the precursor protected by the polymer film may leak out and may react with oxygen and/or moisture, and an inorganic oxide 220 may be formed. As another example, a water-soluble polymer film, such as PVP or polyvinylalcohol, may be formed on the surface of the inorganic oxide precursor, and even when a separate physical impact is not applied, the shell 212 of the polymer film surrounding the core 311 may be easily dissolved by a condensation reaction with external moisture or oxygen. The precursor may be exposed to the outside and may contact external moisture and oxygen, and the inorganic oxide 220 may be formed.

The inorganic oxide 220 may have an external appearance just as a partition and may function as an additional barrier layer for preventing infiltration of moisture and oxygen into the display unit 400.

FIG. 5 illustrates a structure in which the bonding member 200 may be formed only at the edges of the display unit 400 on the upper surface of the substrate 100, based on the structure of FIG. 1. The bonding member 200 selectively including the core-shell structure 210 may be patterned only on edges of the substrate 100, or the core-shell structure 210 may be selectively spread only at edges of the bonding member 200 coated on the substrate 100.

FIG. 6 illustrates a structure in which a functional structure 230 having optical characteristics, such as, for example, polarization and reflection, or electrical characteristics such as conductivity besides the function of preventing infiltration of moisture or oxygen may be applied based on the structure of FIG. 1.

In an embodiment, a structure in which an artificial physical impact such as pressure or heat as described in FIG. 4 may not be applied may be used in consideration of, for example, characteristics of the barrier film 300.

Encapsulation structures are shown in FIGS. 1 and 4 to 6. In an embodiment, various types of encapsulation structures may be implemented.

The bonding member 200 may have a planar upper surface, and the barrier film 300 may be uniformly stacked on the bonding member 200. When the barrier film 300 is uniformly stacked on the bonding member 200, the infiltration of moisture or oxygen may be more effectively prevented, a local stress concentration phenomenon may be prevented, and a stable encapsulation structure may be implemented.

The shell 212 of the core-shell structure 210 may be formed to surround the whole core 211. In an embodiment, the shell 212 may be formed to surround a portion of the core 211 to adjust a forming speed of inorganic oxide or exhibit a specific function.

The barrier film 300 may be formed on an inorganic material to prevent infiltration of moisture or oxygen. For example, the barrier film 300 may be formed of aluminum oxide ($AlO_x$ or $Al_2O_3$), silicon nitride ($SiN_x$ or $Si_3N_4$), zirconium oxide (ZrO), or Al-doped zinc oxide (AZO). In an embodiment, the barrier film 300 may include two or more layers formed of these materials.

The barrier film 300 may be thinner than the bonding member 200 including the core-shell structure 210 and having a planarization function. The barrier film 300 may have an additional function besides a function of preventing infiltration of moisture and oxygen by applying optical or electrical characteristics thereto.

Methods of manufacturing a display apparatus, according to embodiments, will now be described.

Figure 7:
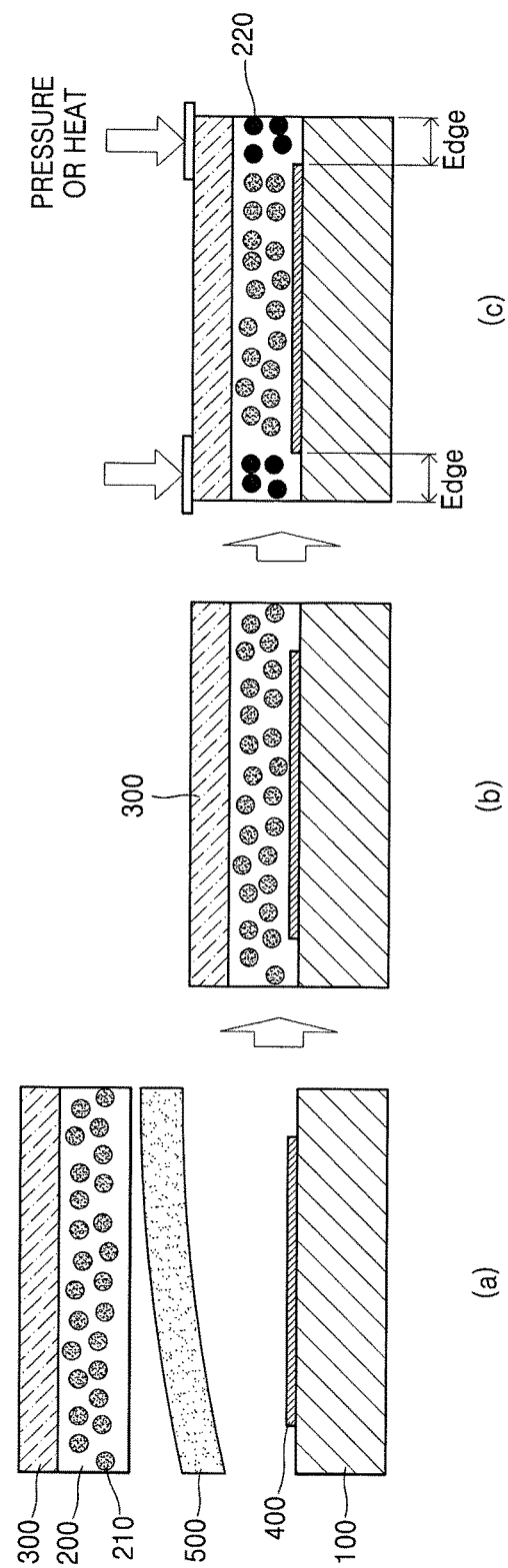
FIGS. 7 and 8 illustrate cross-sectional views for explaining methods of manufacturing the display apparatus of FIG. 1, according to exemplary embodiments.
Figure 8:
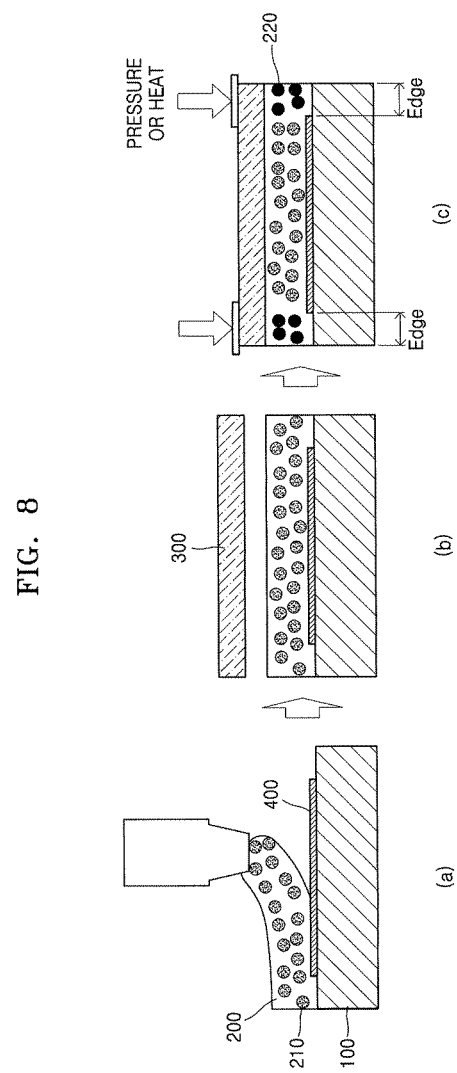

FIGS. 7 and 8 illustrate cross-sectional views for explaining methods of manufacturing the display apparatus of FIG. 1, according to embodiments.

FIG. 7 illustrates a manufacturing method for forming an encapsulation structure of FIG. 4, according to an embodiment.

First, the substrate 100 on which the display unit 400 is formed may be prepared. A process of forming a thin-film array on the substrate 100 has been described above, and the description thereof is omitted. This may be applied not only to the manufacturing method of FIG. 7 but also a manufacturing method of FIG. 8.

Next, a barrier film unit may be formed by preparing the barrier film 300, forming the bonding member 200 including the core-shell structure 210 on one surface of the barrier film 300, and attaching a protective film 500 onto the bonding member 200 such that the barrier film 300, the bonding member 200, and the protective film 500 are sequentially stacked.

The barrier film 300 may be formed by, for example, thermal evaporation, e-beam evaporation, RF sputtering, reactive sputtering, or atomic layer deposition (ALD).

The protective film 500 may be disposed on the one surface of the barrier film 300 to protect the barrier film 300. The protective film 500 may prevent the barrier film 300 from being damaged or contaminated, for example, due to an external scratch or a contamination material. The protective film 500 may be formed of a transparent synthetic resin and may be, for example, a polyvinyl (PV) film, a low density polyester film, or a polyethylene terephthalate film.

Next, the protective film 500 may be removed from the barrier film unit, and the barrier film unit from which the protective film 500 has been removed may be aligned so as to match the substrate 100. This alignment work may be achieved manually or by a mechanical device such a jig.

Finally, the barrier film unit from which the protective film 500 has been removed may be attached to the substrate 100, and an encapsulation structure may be completed.

As a selective embodiment, after attaching the barrier film unit to the substrate 100, applying pressure or heat to a region of the bonding member 200 disposed at the edges of the display unit 400 may be further included. By doing this, as described above, the core-shell structure 210 located at the edges of the display unit 400 may be destroyed, the inorganic oxide 220 may be formed in a partition form, and infiltration of moisture and oxygen into side surfaces of the barrier member 200 may be prevented.

As another selective embodiment, the bonding member 200 may be disposed only at the edges of the display unit 400.

FIG. 8 illustrates a manufacturing method for forming the encapsulation structure of FIG. 4, according to an embodiment.

First, preparing the substrate 100 on which the display unit 400 may be the same as the manufacturing method of FIG. 7.

Next, the bonding member 200 may be formed by coating the substrate 100 with a bonding member paste. The bonding member paste may be sprayed from a nozzle to be coated on the substrate 100.

Thereafter, the barrier film 300 may be prepared, and the encapsulation structure may be completed by attaching the barrier film 300 onto the bonding member 200. A method of forming the barrier film 300 may be the same as the description of FIG. 7.

Furthermore, as a selective embodiment, applying pressure or heat to a region of the bonding member 200 disposed at the edges of the display unit 400 or disposing the bonding member 200 only at the edges of the display unit 400 may also be the same as the description of FIG. 7.

By way of summation and review, a life span of an OLED may be reduced since the OLED deteriorates, for example, due to internal characteristics thereof and external causes such as moisture, oxygen, ultraviolet rays, and device manufacturing conditions. An encapsulation technique of protecting an organic light-emitting device from such external causes, such as, for example, moisture and oxygen, may be an important element to commercialize OLEDs.

Encapsulation techniques of sealing an organic light-emitting device may include, for example, sealing within a metallic can, sealing by using, for example, a glass substrate, and sealing by multi-layer thin-film encapsulation. Multi-layer thin-film encapsulation may merely delay a decrease in a life span of a device since an infiltration path of oxygen or moisture may merely be detoured, and since multi-layer thin-film encapsulation may be manufactured by laminating a plurality of thin films, an encapsulation layer may be thick, and productivity may be lowered.

An encapsulation technique of sealing an organic light-emitting device by using a barrier film may be used for flexible display apparatuses. This method may be a simpler process than that of the multi-layer thin-film structure, but moisture and oxygen may infiltrate into the display apparatus through an adhesive for attaching the barrier film.

One or more exemplary embodiments include a display apparatus having a barrier film that may be capable of effectively preventing infiltration of moisture and oxygen.

As described above, according to the one or more of the above exemplary embodiments, an encapsulation technique suitable for flexible displays may be implemented by using an adhesive including a core-shell structure of an inorganic oxide precursor corpuscle and a polymer protective layer for a barrier film in a display apparatus.

Moisture and oxygen may be prevented from infiltrating through side surfaces of the display apparatus.

A method of manufacturing a display apparatus may exhibit a simpler process and more improved productivity than a comparative thin-film encapsulation structure.

Example embodiments have been disclosed herein, and although specific terms are employed, they are used and are to be interpreted in a generic and descriptive sense only and not for purpose of limitation. In some instances, as would be apparent to one of skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A display apparatus, comprising:
   a substrate;
   a display unit on the substrate;
   a bonding member on the substrate and surrounding at least edges of the display unit; and
   a barrier film on the substrate, the bonding member interposed between the substrate and the barrier film,
   wherein the bonding member includes core-shell particles, the core-shell particles including:
      a core including an oxide, and
      a shell including a polymer chemically bonded to the core, and
   wherein a composition of the bonding member at a first region thereof that overlies the display unit is different from a composition of the bonding member at a second region thereof, the second region being laterally adjacent to the first region and laterally offset from the display unit.

2. The display apparatus as claimed in claim 1, wherein the oxide includes titanium dioxide ($TiO_2$), titanium tetrachloride ($TiCl_4$), or trimethylaluminum ($Al(CH_3)_3$).

3. The display apparatus as claimed in claim 2, wherein the oxide reacts with moisture or oxygen, thereby forming an inorganic oxide.

4. The display apparatus as claimed in claim 1, wherein the polymer includes polyvinylpyrrolidone (PVP), polyvinylalcohol, polymethyl methacrylate, polyacryl, polyester, or a mixture thereof.

5. The display apparatus as claimed in claim 1, wherein the shell surrounds all or a portion of the core in the core-shell structure.

6. The display apparatus as claimed in claim 5, wherein the core-shell structure has a spherical or cylindrical shape.

7. The display apparatus as claimed in claim 6, wherein a diameter of a circular cross-section of the core-shell structure is about 100 nm to about 100 μm.

8. The display apparatus as claimed in claim 1, wherein the bonding member covers the edges of the display unit on the substrate.

9. The display apparatus as claimed in claim 1, wherein the bonding member has a planar upper surface.

10. The display apparatus as claimed in claim 1, wherein the substrate is flexible.

11. The display apparatus as claimed in claim 1, wherein the barrier film includes one or more stacked insulating layers.

12. A method of manufacturing the display apparatus as claimed in claim 1, the method comprising:
preparing the substrate on which the display unit is formed;
forming a barrier film unit;
removing a protective layer from the barrier film unit;
aligning the barrier film unit to match the substrate; and
attaching the barrier film unit to the substrate to form the barrier film on the substrate.

13. The method as claimed in claim 12, wherein forming the barrier film unit includes:
preparing the barrier film;
forming the bonding member on one surface of the barrier film; and
forming the barrier film unit in which the barrier film, the bonding member, and the protective layer are sequentially stacked by attaching a protective layer onto the bonding member.

14. The method as claimed in claim 13, wherein the bonding member is at edges of the display unit.

15. The method as claimed in claim 12, further comprising applying pressure or heat to a region of the bonding member at edges of the display unit after attaching the barrier film unit to the substrate.

16. A method of manufacturing the display apparatus as claimed in claim 1, the method comprising:
preparing the substrate on which the display unit is formed;
forming the bonding member by coating the substrate with a bonding member paste;
preparing the barrier film; and
attaching the barrier film onto the bonding member.

17. The method as claimed in claim 16, wherein the bonding member paste is sprayed onto the substrate from a nozzle.

18. The method as claimed in claim 16, further comprising applying pressure or heat to a region of the bonding member at edges of the display unit after attaching the barrier film to the bonding member.

19. The method as claimed in claim 16, wherein the bonding member is at edges of the display unit.

* * * * *